(12) United States Patent
Owen

(10) Patent No.: US 7,397,001 B2
(45) Date of Patent: Jul. 8, 2008

(54) MULTI-STRAND SUBSTRATE FOR BALL-GRID ARRAY ASSEMBLIES AND METHOD

(75) Inventor: Norman Lee Owen, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/676,810

(22) Filed: Feb. 20, 2007

(65) Prior Publication Data

US 2007/0137889 A1   Jun. 21, 2007

Related U.S. Application Data

(63) Continuation of application No. 10/741,065, filed on Dec. 19, 2003, now Pat. No. 7,199,306, which is a continuation of application No. 10/255,257, filed on Sep. 26, 2002, now Pat. No. 6,710,265, which is a continuation of application No. 08/349,281, filed on Dec. 5, 1994, now Pat. No. 6,465,743.

(51) Int. Cl.
*H05K 1/16* (2006.01)

(52) U.S. Cl. .................. 174/260; 174/261; 174/521; 361/805

(58) Field of Classification Search .................. None
See application file for complete search history.

(56) References Cited

U.S. PATENT DOCUMENTS 3,413,713 A    12/1968   Heida et al.
3,444,441 A    5/1969    Heida et al.
3,606,673 A    9/1971    Overman
4,530,152 A    7/1985    Roche et al.
4,674,811 A    6/1987    Corwin
4,703,984 A    11/1987   Mitchell, Jr.
4,734,820 A    3/1988    Lauffer et al.

(Continued)

FOREIGN PATENT DOCUMENTS

EP      0261324 A1    3/1988

(Continued)

OTHER PUBLICATIONS

"Ball Grid Array Package"; Design Requirements for Outlines of Solid State and Related Products; Jun. 2000; 19 pp; JDEC Standard No. 95-1, Section 14; JDEC Solid State Products Engineering Council.

(Continued)

*Primary Examiner*—Tuan T Dinh
(74) *Attorney, Agent, or Firm*—Patricia Goodard; Ranjeev Singh

(57) ABSTRACT

A multi-strand printed circuit board substrate for ball-grid array (BGA) assemblies includes a printed wiring board (11) having a plurality of BGA substrates (12) arranged in N rows (14) and M columns (16) to form an N by M array. N and M are greater than or equal to 2 and the size of the N by M array is selected such that each of the plurality of BGA substrates (12) maintains a planarity variation less than approximately 0.15 mm (approximately 6 mils). The printed wiring board (11) has a thickness (26) sufficient to minimize planarity variation and to allow a manufacturer to use automated assembly equipment without having to use support pallets or trays.

22 Claims, 2 Drawing Sheets

U.S. PATENT DOCUMENTS

| | | | |
|---|---|---|---|
| 4,737,395 | A | 4/1988 | Mabuchi et al. |
| 4,773,955 | A | 9/1988 | Mabuchi et al. |
| 4,821,007 | A | 4/1989 | Fields et al. |
| 4,866,841 | A | 9/1989 | Hubbard |
| 4,870,474 | A | 9/1989 | Karashima |
| 4,890,383 | A | 1/1990 | Lumbard et al. |
| 4,961,821 | A | 10/1990 | Drake et al. |
| 4,994,936 | A | 2/1991 | Hernandez |
| 4,999,700 | A | 3/1991 | Dunaway et al. |
| 5,000,689 | A | 3/1991 | Ishizuka et al. |
| 5,006,673 | A | 4/1991 | Freyman et al. |
| 5,061,657 | A | 10/1991 | Queen et al. |
| 5,071,375 | A | 12/1991 | Savage, Jr. |
| 5,136,366 | A | 8/1992 | Worp et al. |
| 5,153,385 | A | 10/1992 | Juskey et al. |
| 5,188,984 | A | 2/1993 | Nishiguchi |
| 5,251,107 | A | 10/1993 | Takemura et al. |
| 5,280,193 | A | 1/1994 | Lin et al. |
| 5,302,101 | A | 4/1994 | Nishimura |
| 5,336,931 | A | 8/1994 | Juskey et al. |
| 5,338,972 | A | 8/1994 | Negoro |
| 5,355,283 | A | 10/1994 | Marrs et al. |
| 5,433,822 | A | 7/1995 | Mimura et al. |
| 5,450,283 | A | 9/1995 | Lin et al. |
| 5,462,636 | A | 10/1995 | Chen et al. |
| 5,467,253 | A | 11/1995 | Heckman et al. |
| 5,491,111 | A | 2/1996 | Tai |
| 5,592,025 | A | 1/1997 | Clark et al. |
| 5,604,160 | A | 2/1997 | Warfield |
| 5,612,513 | A | 3/1997 | Tuttle et al. |
| 5,635,671 | A | 6/1997 | Freyman et al. |
| 5,641,714 | A | 6/1997 | Yamanaka |
| 5,652,185 | A | 7/1997 | Lee |
| 5,690,773 | A | 11/1997 | Fidalgo et al. |
| 5,729,437 | A | 3/1998 | Hashimoto |
| 5,776,798 | A | 7/1998 | Quan et al. |
| 5,976,912 | A | 11/1999 | Fukutomi et al. |
| 5,981,314 | A | 11/1999 | Glenn et al. |

FOREIGN PATENT DOCUMENTS

| | | |
|---|---|---|
| JP | 61222151 | 10/1986 |
| JP | 02047855 | 2/1990 |
| JP | 02301155 | 12/1990 |
| JP | 4148553 | 5/1992 |
| JP | 04254363 | 9/1992 |
| JP | 05129517 | 5/1993 |
| JP | 05190737 | 7/1993 |
| JP | 05315515 | 11/1993 |
| JP | 661417 | 3/1994 |
| JP | 6132423 | 5/1994 |
| JP | 06169051 | 6/1994 |
| JP | 06216179 | 8/1994 |
| WO | 9414213 | 6/1994 |
| WO | 9526047 | 9/1995 |

OTHER PUBLICATIONS

"Coplanarity Test for Surface-Mount Semiconductor Devices"; JEDEC Standard; JESD22-B108; Nov. 1991; 6pp; Electronic Industries Association, Engineering Department.

Ouimet, Sylvain et al.; "Overmold Technology applied to Cavity Down Utrafine Pitch PBGA Package"; 48th Electronic Components & Technology Conference; 1998; cover & pp. 458-462; IEEE.

Arnold, et al., "Materials—Stressed Out—Microelectronic Encapsulation Finds Cure in Aerobic Adhesives," Advanced Packaging, Jan.-Feb. 1996, pp. 30 & 32-34.

Hotta, Yuji et al.; "Foil covered PACkage (FPAC): A New Package concept"; 46th Electronic Components & Technology Conference; 1996; Cover Page & pp. 1258-1264; IEEE Catalog No. 96CH35931.

Yip, Laurene et al; "Package Warpage Evaluation for High Performance PQFP"; 45th Electronic Components and Technology Conference;1995; Cover Page & pp. 229-233; IEEE Catalog 95CH3582-0.

HYSOL® FP4451 Flow Control Dam Product Bulletin; Dexter Electronic Materials Division; 2 pgs; Mar. 1995.

HYSOL® FP4650 Liquid Encapsulant Product Bulletin; Dexter Electronic Materials Division; 4 pgs; Aug. 1995.

Boutin, Lynda; "Mold Compound Study for Plastic Ball Grid Array Applications"; Proceedings of the Technical Program, NEPCON East '95; Jun. 12-15, 1995; Cover Page & pp. 279-290; Boston.

Burkhart, Art et al.; "New Generation Encapsulants For Chips On Low Cost First Level Substrates"; Dexter Technical Paper; Feb. 1994; pp. 1-8; USA.

Manzione, Louis T.; "Plastic Packaging of Microelectronic Devices"; AT&T Bell Laboratories Publication; 1990; 4 pgs.

McPherson, J.W. et al; "A Novel Thermal Expansion Matched Heatspreader for Plastic Encapsulation of Silicon Chips"; 25th Annual Proceedings, Reliability Physics 1987; Apr. 7-9, 1987; Cover Page & pp. 224-228; IEEE Catalog No. 87CH2388-7.

Murphy, William; "Custom Molded Cavities"; Technical Papers, Regional Technical Conference, Society of Plastics Engineers, Inc.; Mar. 6-7, 1985; 6 pgs.

Menges, Prof. Dr. Georg et al.; Electric-discharge machining (EDM):; How to Make Injection Molds; 1983; 5 pgs; Hanser Publishers.

Schumacher, Dr. B.; "The Significance of Electrical Discharge Machining (EDM) IN Mold Making"; Mold-Making Handbook for the Plastics Engineer, Chapter 6, 1983; 17 pgs; Hanser Publishers, NY.

Hull, John L..; "Equipment and Techniques for Plastic Encapsulation of Electrical and Electronic Devices"; 36th Annual Technical Conference, Society of Plastics Engineers; Apr. 24-27, 1978; Cover Page & pp. 595-599; USA.

Corner, Harold L.; "The moldmakin Trades: The Key to Success or Failure of the Plastics Industry"; 36th Annual Technical Conference, Society of Plastics Engineers; Apr. 24-27, 1978; Cover Page & pp. 172-174; USA.

Fortin, M.J.; "Automated Rotary Transfer Encapsulation of Electronic Parts"; 28th Annual Technical Conference, Society of Plastics Engineers, My 4-7, 1970; Cover Page & pp. 160-161; USA.

Kluz, John; "Methods of Producing Cores and Cavities"; Moldmaking and Die Cast Dies for Apprentice Training; Chapter VIII; 1967; National Tool, Die and Precision Machining Association; Washington, D.C.

Jameson, E.C.; "Electrical Discharge Machining of Mold Cavities ands Cores"; Technical Papers, SPE Regional Technical Conference: Tooling for Plastics-Design and Construction Sep. 30, 1965; Cover Page & pp. 17-21; USA.

Ross, Milton, I.; "Electric Discharge Cutting of Mold Components"; Technical Papers, SPE Regional Technical Conference-Advances in Moldmaking and Mold Design; Apr. 17, 1964; Cover Page pp. 14-18, Society of Plastics Engineers.

Tummala, Rao R.; "Fundamentals of Sealing and Encapsulation"; Fundmentals of Microsystems Packaging, Chapter 15; cover pages & pp. 599-603; McGraw Hill.

MULTI-STRAND SUBSTRATE FOR BALL-GRID ARRAY ASSEMBLIES AND METHOD

This application is a continuation of U.S. application Ser. No. 10/741,065, filed Dec. 19, 2003 now U.S. Pat. No. 7,199,306, which is a continuation of U.S. application Ser. No. 10/255,257, filed Sep. 26, 2002 now U.S. Pat. No. 6,710,265, which is a continuation of U.S. application Ser. No. 08/349,281 filed Dec. 5, 1994 now U.S. Pat. No. 6,465,743.

BACKGROUND OF THE INVENTION

This invention relates, in general, to semiconductor packages, and more particularly, to ball-grid array semiconductor packaging.

Ball-grid array (BGA) semiconductor packages are well known in the electronics industry. BGA packages provide denser surface mount interconnects than quad flat pack (QFP) packages. Industry consensus is that BGA packages are more cost effective than QFP packages for input/output (I/O) requirements greater than 250. However, there is a great demand for cost effective BGA solutions down to 100 I/O.

During the assembly of a BGA package, an organic resin printed wiring board substrate having a thickness on the order of 0.35 millimeters (mm) is placed on a metal pallet or support device. The metal pallet provides support for the printed wiring board during the majority of assembly steps. The printed wiring board comprises a single BGA substrate or a single row or strand of a number of BGA substrates. The largest available single strand printed wiring board is a 1×6 printed wiring board with a maximum total length of about 200 mm. Next, a semiconductor die having a multitude of bonding pads is attached to a die pad located on the top side of the BGA substrate. Wire bonds are then attached to the bonding pads and to bond posts on the top side of the BGA substrate. Next, the semiconductor die and the wire bonds are encapsulated with an organic material. After encapsulation, the encapsulation material is cured at an elevated temperature. Conductive solder balls are then attached to contact pads, which are on the lower side of the BGA substrate and electrically coupled through conductive traces to the bond posts, using a solder reflow process. Each BGA package is then marked. When a single strand of multiple BGA packages is used, a singulation process such as a punch press is used to separate the multiple BGA packages into single units.

The above assembly process has several disadvantages. Because the above process requires a metal pallet to support the thin BGA substrates during the majority of assembly steps, the process is not conducive to large scale automated assembly. As a result, manufacturers must purchase additional equipment to assemble BGA packages. This requires capital investment in equipment and additional factory space. Also, because only single substrates or a single strand of a several substrates is used, it is difficult for manufacturers to produce a large volume of BGA packages efficiently. In addition, the above process requires significant labor inputs to load and unload the metal pallets or support devices at the various process steps. This negatively impacts manufacturing cycle time and quality. Furthermore, the pallets are expensive because they require precise tolerances for use with automated equipment and they require a manufacturer to carry a large inventory to support work-in-process (WIP) throughout a manufacturing line.

Industry standards require that after assembly, each BGA substrate must maintain a planarity variation of less than approximately 0.15 mm (approximately 6 mils) as measured at three points across a substrate. In other words, each BGA substrate must not be excessively warped or non-planar. Because of this strict standard and a concern over warpage, printed wiring board suppliers and BGA semiconductor manufacturers have not been motivated to expand beyond the existing 1×6 single strand printed wiring board.

With the rapid increase in demand for BGA packages, it is readily apparent that a need exists for cost effective printed wiring board substrates that are conducive to large scale automated assembly, that support existing automated assembly equipment, and that do not warp during the assembly process.

DETAILED DESCRIPTION OF THIS DRAWINGS

Figure 1:
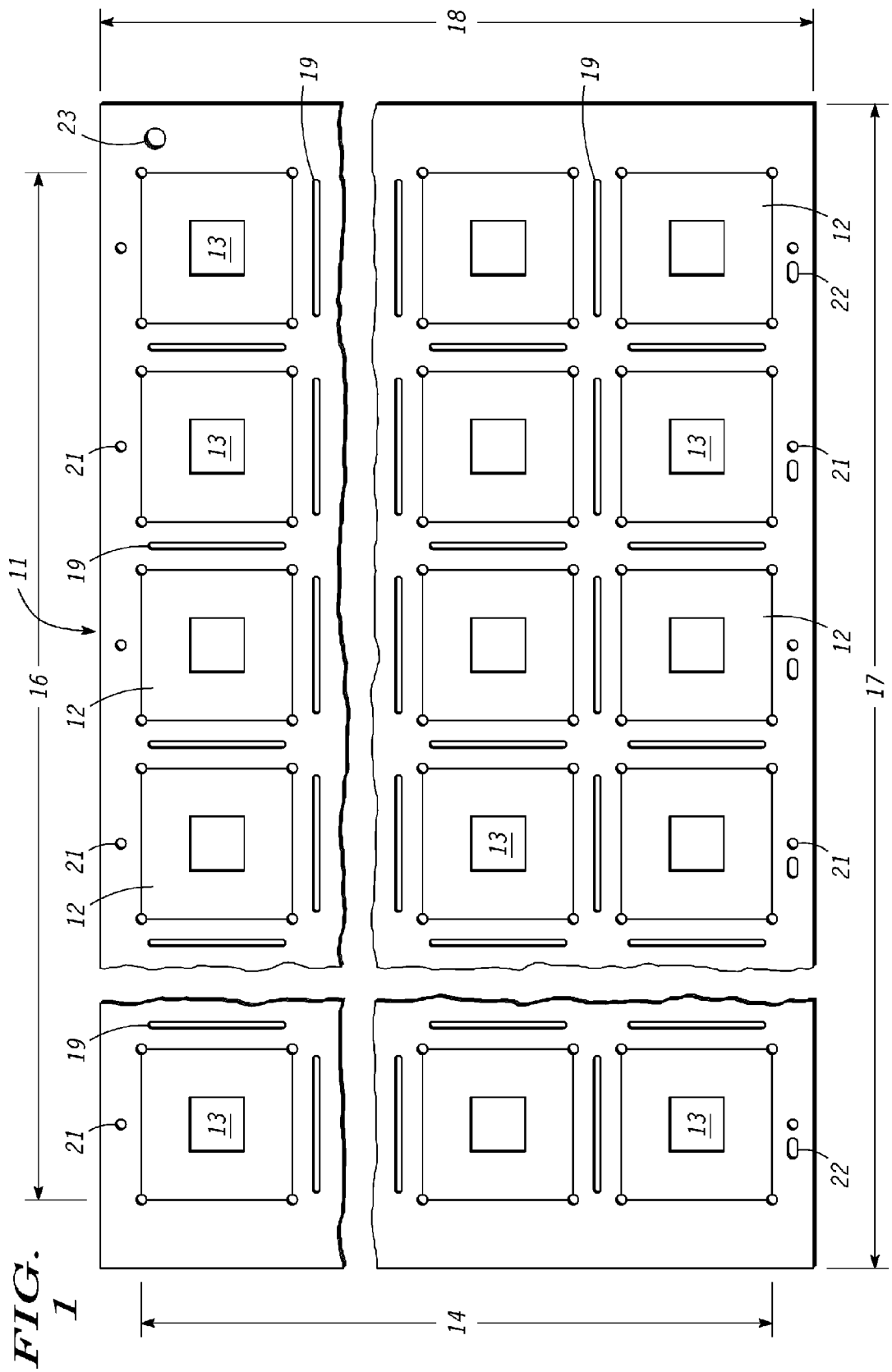
FIG. 1 illustrates a top view of an embodiment of a printed circuit board substrate for BGA assemblies according to the present invention.
Figure 2:
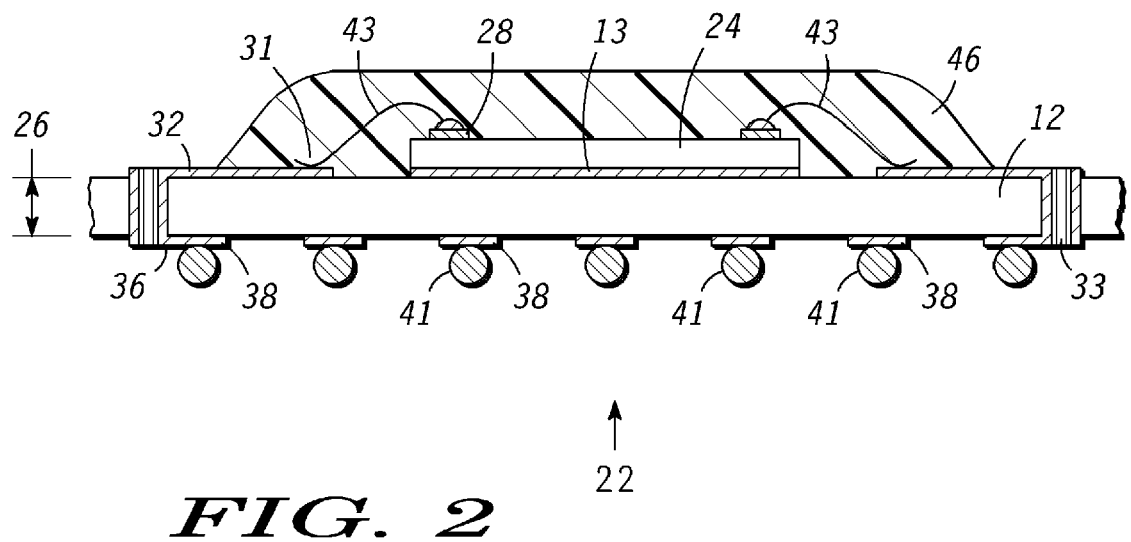
FIG. 2 illustrates an enlarged cross-sectional side view of one BGA assembly according to FIG. 1.

The present invention can be better understood with reference to the FIGS. 1 and 2. FIG. 1 illustrates a top view of multi-strand substrate, printed circuit board, or wiring board (PCB) 11. PCB 11 typically comprises an organic epoxy-glass resin based material, such as bismaleimide-triazin (BT) resin, FR-4 board, or the like. PCB 11 includes BGA substrates or patterned package substrates 12 arranged in N rows 14 and M columns 16 to form an N by M pattern or array. Each of BGA substrates 12 includes a die attach or bonding pad 13, which typically comprises copper or gold plated copper. Die attach pad 13 is a solid metallization area or a patterned metallization area shaped like a cross, "Union Jack", or other specialized geometry. To avoid overcrowding the drawing, conductive traces are not shown (conductive traces are shown in FIG. 2). PCB 11 is formed using well known printed circuit board manufacturing techniques.

To support efficient large scale automated assembly, N and M are preferably at least greater than or equal to 2. Depending on the final dimensions of BGA substrates 12, N and M are selected such that after all assembly steps are completed, each of BGA substrates 12 exhibit a planarity variation of less than approximately 0.15 mm across each of BGA substrates 12. In other words, during assembly, each of BGA substrates 12 does not warp to a non-planar condition in excess of approximately 0.15 mm. Also, PCB 11 has a thickness 26 (shown in FIG. 2) sufficient to minimize warpage or non-planarity. As stated below, thickness 26 preferably is on an order of at least 0.5 mm. According to standard industry practice, warpage within a given unit is determined by measuring a maximum difference between a seating plane (formed by the three conductive solder balls (see FIG. 2) having the greatest amount of standoff from the BGA substrate) and the conductive solder ball with the least amount of stand-off from the substrate. The warpage measurement is taken after PCB 11 is separated into individual BGA units.

Preferably, PCB 11 further includes a plurality of stress-relief slots or slots 19 at various locations on PCB 11. Preferably, slots 19 extend through PCB 11. Slots 19 are all the same size or of different sizes. Slots 19 further minimize warpage of each of BGA substrates 12. Also, PCB 11 preferably includes alignment holes 21 along one side or both sides of PCB 11. Alignment holes 21 extend from the top surface to the lower surface of PCB 11. Alignment holes 21 are placed according to the requirements of die attaching and wire bonding equipment to support automated assembly. Additionally, PCB 11 preferably includes holes 22 around the perimeter of PCB 11 and hole 23 along one side of PCB 11. Holes 22 provide for an automatic orientation feature so that a manufacturer does not insert PCB 11 into assembly equipment backwards or reversed. Hole 23 provides for an orientation feature to allow a manufacturer to robotically place PCB 11 in a jig apparatus.

In a preferred embodiment for a 27 mm by 27 mm BGA device, N is equal to 2 and M is equal to 6 with PCB 11 having a length 17 on an order of 187 mm and a width 18 on an order of 63 mm. The above specifications also are preferred for a 23 mm by 23 mm and a 25 mm by 25 mm BGA device. In a preferred embodiment for a 9 mm by 9 mm BGA device, N is equal to 4 and M is equal to 12 with length 17 on an order of 200 mm and width 18 on an order of 63 mm. In a preferred embodiment for a 10.4 mm by 10.4 mm BGA device, N is equal to 4 and M is equal to 12 with length 17 on an order of 212 mm and width 18 on an order of 63 mm. In a preferred embodiment for a 15 mm by 15 mm BGA device, N is equal to 3 and M is equal to 9 with length 17 on an order of 187 mm and width 18 on an order of 63 mm. In a preferred embodiment for a 14 mm by 22 mm BGA device, N is equal to 2 and M is equal to 9 with length 17 on an order of 187 mm and width 18 on an order of 63 mm. Optionally, for a 14 mm by 22 mm BGA device, N is equal to 3 and M is equal 6 with length 17 and width 18 the same as above. In a preferred embodiment for a 35 mm by 35 mm BGA device, N is equal to 1 and M is equal to 4 with length 17 on an order of 187 mm and width 18 on an order of 63 mm. The above dimensions are preferred to take advantage of standard automatic assembly equipment requirements. This allows a manufacturer to use existing tooling and equipment. The above dimensions are easily modified to meet the requirements of different types of automated assembly equipment.

FIG. 2 illustrates an enlarged cross-sectional view of one BGA structure, assembly, or package 25 after assembly but before singulation or separation into individual packages. BGA structure 25 comprises one of BGA substrates 12 within PCB 11 PCB 11 with BGA substrates 12 preferably has a thickness 26 such that PCB 11 can undergo magazine-to-magazine automated assembly processes without using a metal support pallet. Currently available single BGA substrate PIB's and single strand BGA substrates PIB's have thicknesses on the order of 0.35 mm, which is too flimsy for reliable automated assembly unless pallets or carriers are used. Thickness 26 also is selected to minimize planarity variation of each of BGA substrates 12. Preferably, thickness 26 is greater than approximately 0.5 mm. Preferably, thickness 26 is in a range from approximately 0.5 mm to approximately 0.8 mm.

BGA structure 25 further includes a semiconductor die 24 attached die attach pad 13 on an upper surface of each of BGA substrates 12. Semiconductor die 24 has a plurality of bonding or bond pads 28. Each of BGA substrates 12 has a conductive connective structure comprising bond posts 31, upper conductive traces 32, vias 33, lower conductive traces 36 and contact pads 38. Conductive solder balls 41 are attached to contact pads 38. Conductive wires or wire bonds 43 electrically couple bond pads 28 to bond posts 31. Alternatively, semiconductor die 24 is mounted in a "flip-chip" embodiment with bond pads 28 directly connected to bond posts directly below bond pads 28, eliminating conductive wires 43 and die attach pad 13. An encapsulating layer or encapsulant 46 covers semiconductor die 24 and wire bonds 43 to provide protection of active circuit elements from physical damage and/or corrosion.

A typical BGA assembly process incorporating PCB 11 having BGA substrates 12 to form BGA structure 25 is described as follows. First PCB 11 is provided having the desired N by M pattern. PCB 11 is loaded onto an automated die attach machine such as an ESEC 2006. This type of die attach machine is an industry standard machine that manufacturers use to attach semiconductor die to other types of semiconductor packages such as plastic dual-in-line (PDIP), small outline integrated circuit (SOlO), and QFP packages. The die attach machine automatically attaches one semiconductor die 24 to one of die attach pads 13 on PCB 11. Preferably, semiconductor die 24 is attached to one of die attach pads 13 using a die attach epoxy.

After die attach, PCB 11 is then cleaned using an automated cleaning system such as an ULVAC cleaning system available from the ULVAC Corp. Next, PCB 11 is placed on an automated wire bonder such as a Shinkawa UTC-100 where wire bonds 43 are attached to bond pads 22 and bond posts 31. In conventional BGA processing, wire bonding is done using a similar wirebonder configured for semi-automatic operation.

Next, encapsulant 46 is applied to cover semiconductor die 24 and wire bonds 43. Encapsulant 46 comprises an organic material and is applied using an over-mold process or a glob-top process. For an over-mold process, automolds from Towa, Fico, or similar suppliers are used. When an over-molding process is used, encapsulant 46 preferably comprises an organic mold compound. When a glob-top process is used, encapsulant 46 preferably comprises an anhydride epoxy organic compound. Preferably, the material selected for encapsulant 46 has a thermal coefficients of expansion (TCE) close (within a few points or parts per million) to the TCE's of the material of PCB 11 and semiconductor die 24. This further helps to minimize warpage of BGA substrates 12 during the remainder of the assembly process. Such encapsulents are available from several suppliers including The Dexter Corp., of Industry, Calif., Ciba-Giegy Corp., Hitachi Corp., Sumitomo Corp., and Nitto-Denko Corp.

Next, encapsulant 46 is cured preferably using a belt furnace, vertical oven, or batch oven at a temperature that is function of the type of material used for encapsulant 46. For the curing process, a tray or some other form of protection preferably is used to protect contact pads 38 from foreign matter contamination.

After encapsulation, conductive solder balls 41 are attached to contact pads 38 using a room temperature attach process. Next, an automated solder reflow process is used to reflow conductive solder balls 41. Automated reflow equipment such as a belt furnace. After reflow, PCB 11 is again cleaned using automated cleaning equipment with an aqueous or terpene media to remove any corrosive flux residues from the conductive solder ball attachment process. Each BGA structure 22 is then marked on an automated marking machine such as an automated laser marker. Optionally, marking occurs immediately following encapsulation. Finally each of BGA substrates 12 is divided into individual packages. To divide the packages, a punch-press process is used. Optionally, a routing, dicing, or snapping separation process is used.

By now it should appreciated that there has been provided a multi-strand PCB containing an N by M array of BGA substrates for manufacturing BGA type semiconductor packages. N and M are selected and the thickness of the PCB is such so as to enable enhanced manufacturing efficiency. The enhanced manufacturing efficiency comes from the ability to manufacture more BGA packages from one multi-strand PCB and from the ability to use standard automated assembly equipment. Manufacturing efficiency is enhanced while still providing BGA substrate planarity variation less than approximately 0.15 mm. Because the multi-strand PCB according to the present invention enables the use of standard automated assembly equipment, a BGA manufacturer is able to use the same types of equipment to manufacture different types of packages thus reducing capital expenditures and needed factory floor space. Also, labor costs are reduced and quality is increased because of the reduced handling requirements.

The invention claimed is:

1. A method for assembling ball-grid array (BGA) packages, comprising the steps of:
   providing a plurality of BGA substrates arranged in an N by M array within a printed circuit board having a thickness, wherein N and M are greater than or equal to 2, each BGA substrate having a plurality of bond posts and a plurality of contact pads;
   attaching a semiconductor die to each of the plurality of BGA substrates, wherein each BGA substrate corresponds to an attached semiconductor die, each semiconductor die having a plurality of bond pads;
   encapsulating the semiconductor die with an encapsulant;
   curing the encapsulant; and
   dividing the N by M array into separate BGA packages, wherein the size of the N by M array and the thickness of the printed circuit board are such that each of the plurality of BGA substrates maintains a planarity variation less than approximately 0.15 mm after assembly.

2. The method of claim 1, wherein each of the plurality of BGA substrates corresponds to an individual device.

3. The method of claim 1, wherein each of one of BGA substrates within the plurality of BGA substrates has a corresponding individual device within a plurality of individual devices.

4. The method of claim 1, wherein the step of attaching comprises attaching a first die to a first one of the plurality of BGA substrates and attaching a second die to a second one of the plurality of BGA substrates.

5. The method of claim 1, wherein the step of encapsulating the semiconductor die includes encapsulating with an encapsulant having a thermal coefficient of expansion close to that of the printed circuit board.

6. The method of claim 1, wherein the step of providing the plurality of BGA substrates arranged in the N by M array within the printed circuit board includes providing the plurality of BGA substrates within the printed circuit board having a plurality of stress-relief slots at various locations within the printed circuit board.

7. The method of claim 1, wherein the step of providing the plurality of BGA substrates arranged in the N by M array within the printed circuit board includes providing the plurality of BGA substrates within the printed circuit board having a thickness greater than approximately 0.5 mm.

8. The method of claim 1, wherein the step of providing the plurality of BGA substrates arranged in the N by M array within the printed circuit board includes providing the plurality of BGA substrates within the printed circuit board having a width on an order of 63 mm.

9. The method of claim 1, wherein the step of providing the plurality of BGA substrates arranged in the N by M array within the printed circuit board includes providing the plurality of BGA substrates within the printed circuit board having a length in a range from approximately 187 mm to 12 mm.

10. The method of claim 1, wherein the at least one bond pad comprises copper or gold plated copper.

11. The method of claim 2, wherein each of the individual devices comprises a semiconductor die.

12. The method of claim 6, wherein at least one of the plurality of stress-relief slots is of a different size from another of the plurality of stress-relief slots.

13. The method of claim 10, wherein the at least one bond pad is one of a solid metallization area or a patterned metallization area having a specific geometric shape, wherein the specific geometric shape is a cross or Union Jack.

14. The method of claim 2, wherein the step of attaching comprises attaching a first die to a first one of the plurality of BGA substrates and attaching a second die to a second one of the plurality of BGA substrates.

15. The method of claim 14, wherein the step of encapsulating the semiconductor die includes encapsulating with an encapsulant having a thermal coefficient of expansion close to that of the printed circuit board.

16. The method of claim 15, wherein the step of providing the plurality of BGA substrates arranged in the N by M array within the printed circuit board includes providing the plurality of BGA substrates within the printed circuit board having a plurality of stress-relief slots at various locations within the printed circuit board.

17. The method of claim 16, wherein the step of providing the plurality of BGA substrates arranged in the N by M array within the printed circuit board includes providing the plurality of BGA substrates within the printed circuit board having a thickness greater than approximately 0.5 mm.

18. The method of claim 17, wherein the step of providing the plurality of BGA substrates arranged in the N by M array within the printed circuit board includes providing the plurality of BGA substrates within the printed circuit board having a width on an order of 63 mm.

19. The method of claim 18, wherein the step of providing the plurality of BGA substrates arranged in the N by M array within the printed circuit board includes providing the plurality of BGA substrates within the printed circuit board having a length in a range from approximately 187 mm to 12 mm.

20. The method of claim 16, wherein at least one of the plurality of stress-relief slots is of a different size from another of the plurality of stress-relief slots.

21. The method of claim 20, wherein the at least one bond pad comprises copper or gold plated copper.

22. The method of claim 21, wherein the at least one bond pad is one of a solid metallization area or a patterned metallization area having a specific geometric shape, wherein the specific geometric shape is a cross or Union Jack.

* * * * *